(12) United States Patent
Szu

(10) Patent No.: US 6,695,624 B1
(45) Date of Patent: Feb. 24, 2004

(54) ELECTRICAL CONTACTS USED IN AN ELECTRICAL CONNECTOR

(75) Inventor: Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/397,509

(22) Filed: Mar. 25, 2003

(30) Foreign Application Priority Data

Nov. 29, 2002 (TW) ...................................... 91219316 U

(51) Int. Cl.[7] .............................................. H01R 12/00
(52) U.S. Cl. ........................... 439/66; 439/71; 439/342; 439/862; 439/891
(58) Field of Search ........................... 439/66, 71, 891, 439/862, 342

(56) References Cited

U.S. PATENT DOCUMENTS

| | | | | |
|---|---|---|---|---|
| 5,551,883 A | * | 9/1996 | Davis | 439/65 |
| 6,454,588 B1 | * | 9/2002 | Pickles et al. | 439/342 |
| 6,478,600 B1 | * | 11/2002 | Wang et al. | 439/342 |
| 6,561,817 B1 | * | 5/2003 | Ma | 439/66 |
| 6,585,527 B2 | * | 7/2003 | Koopman et al. | 439/71 |

FOREIGN PATENT DOCUMENTS

TW 444960 7/2001

* cited by examiner

*Primary Examiner*—Truc Nguyen
(74) *Attorney, Agent, or Firm*—Wei Te Chung

(57) ABSTRACT

An electrical connector includes a base (4) defining a surface (42) and a number of passageways (41), and a number of contacts (1). Each contact comprises an engaging portion (11) for engaging in the passageway, a medial portion (13) extending upwardly from an end of the engaging portion, a solder portion (12) extending perpendicularly from an opposite end of the engaging portion, an inclined portion (14) extending aslant from the medial portion, and a cantilever (15) extending from the inclined portion. The inclined portion and the medial portion form therebetween a connecting portion having a first line. The first line forms an angle relative to the surface of the base. The inclined portion and the cantilever form a connecting portion therebetween having a second line, the second line forming an angle relative to the surface of the base. A contact portion (17) is defined on an upper end of the cantilever.

2 Claims, 4 Drawing Sheets

ELECTRICAL CONTACTS USED IN AN ELECTRICAL CONNECTOR

BACKGROUND OF THE INVENTION

1. Field of the Invention

The present invention relates to contacts, and particularly to high elasticity contacts used in electrical connectors for connecting an electronic package, such as a central processing unit (CPU), with a circuit substrate, such as a printed circuit board (PCB).

2. Description of the Prior Art

Conventional electrical connectors for connecting a land grid array (LGA) chip package with a PCB comprise a base and a number of contacts. At present, the size of the electrical connectors used in computers is becoming steadily smaller with computers becoming smaller. Thus, the contacts of the electrical connectors need to have long, elastically deformable arms in order to ensure reliable electrical connections between the connectors and the LGA packages mounted on the connectors. A typical electrical connector is disclosed in Taiwan Patent No. 44960. Referring to FIGS. 5, 6 and 7, the connector comprises a base 8 defining a number of passageways 80 arranged in a matrix having several rows and columns, and a corresponding number of contacts 9 received in the passageways 80. Each contact 9 defines a long elastic arm 92 and an engaging portion 91, and the engaging portions 91 of all contacts, before being severed from a carrier strip, are arranged in a line. Accordingly, each passageway 80 defines two slots 82 for engaging with the engaging portion 91 of the contact 9 to fix the contact 9 in the passageway 80. Two slots 82 of each passageway 80 form a line oriented at an angle, for example 45 degrees, relative to rows or columns of the matrix. Thus, after the contacts 9 are inserted into the passageways 80 of the base 8, the arms 92 of the contacts 9 are each oriented at 45 degrees relative to the rows or columns when viewing along a direction perpendicular to the plane of the base 8. This configuration provides each passageway 80 with sufficient space to receive the long elastic arm 92 of the contact 9. However, in manufacturing, limited by the present manufacturing capability, the contacts 9 situated along the diagonal direction of 45 degrees are inserted into the passageways 80 of the base 8 at the same time. That is to say, firstly one contact 9 is inserted in a corner of the base 8, secondly two contacts 9 are inserted in the next adjoining diagonal row, and thirdly three contacts 9 are inserted in the third diagonal row, and so on, which obviously increases the difficulty of manufacturing.

In view of the above, a new electrical connector that overcomes the above-mentioned disadvantages is desired.

SUMMARY OF THE INVENTION

Accordingly, an object of the present invention is to provide a high elasticity contact for use in an electrical connector which enables reliable electrical connection between an electronic package and a printed circuit board (PCB) while, at the same time, making the connector easy to manufacture.

To achieve the above-mentioned object, an electrical contact in accordance with a preferred embodiment of the present invention is received in a passageway of a base defining a surface. Each contact comprises an engaging portion for engaging in the passageway of the base, a medial portion extending upwardly from the engaging portion, a solder portion extending perpendicularly from the engaging portion, an inclined portion extending aslant from the medial portion, and a cantilever extending upwardly from the inclined portion. The inclined portion and the medial portion form a connecting portion therebetween having a first line. The first line forms an angle relative to the surface of the base when the contact is assembled in the base. The inclined portion and the cantilever form a connecting portion therebetween having a second line, and the second line forms an angle relative to the surface of the base. A contact portion is defined on an upper end of the cantilever.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Referring to FIGS. 1 to 4, a number of electrical contacts 1 are received in a base 4 for electrically connecting an electronic package such as a central processing unit (CPU) 2 with a circuit substrate such as a printed circuit board (PCB) 3.

Figure 2:
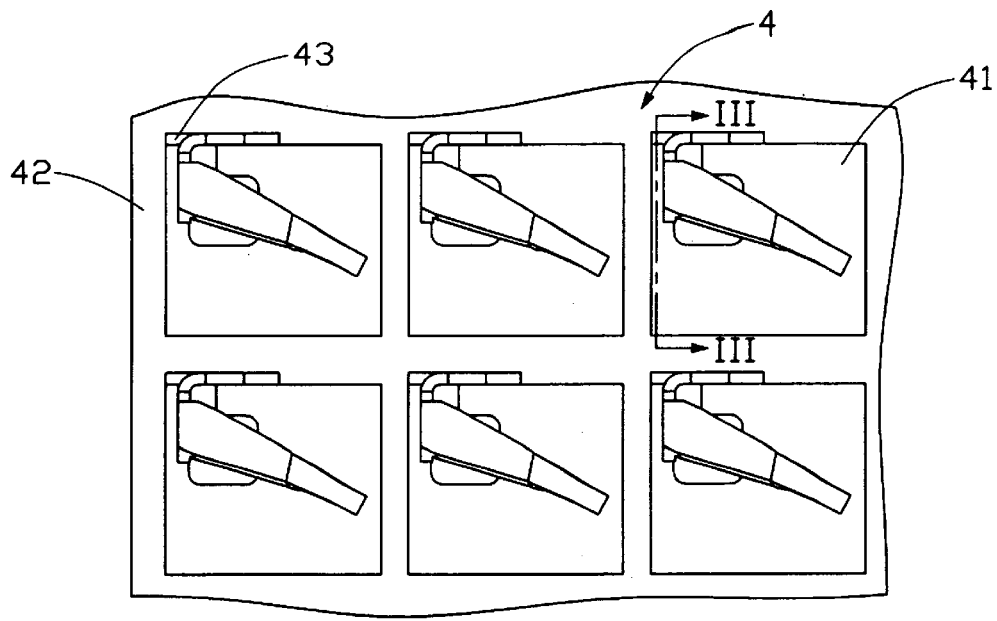
FIG. 2 is a top plan view of a portion of an electrical connector, showing several electrical contacts of FIG. 1 received in corresponding passageways of a base of the electrical connector.

Referring to FIG. 2, the base 4 defines a number of passageways 41 for receiving the electrical contacts 1 therein, and a surface 42. The passageways 41 are arranged in a matrix having several rows and columns. A slot 43 is formed on one inside wall of each passageway 41. The slots 43 of each row of the passageways 41 form a line parallel to the rows or columns. Thus, in manufacturing, it is convenient to insert the contacts 1 of each row or column into the passageways 41 at the same time.

Figure 1:
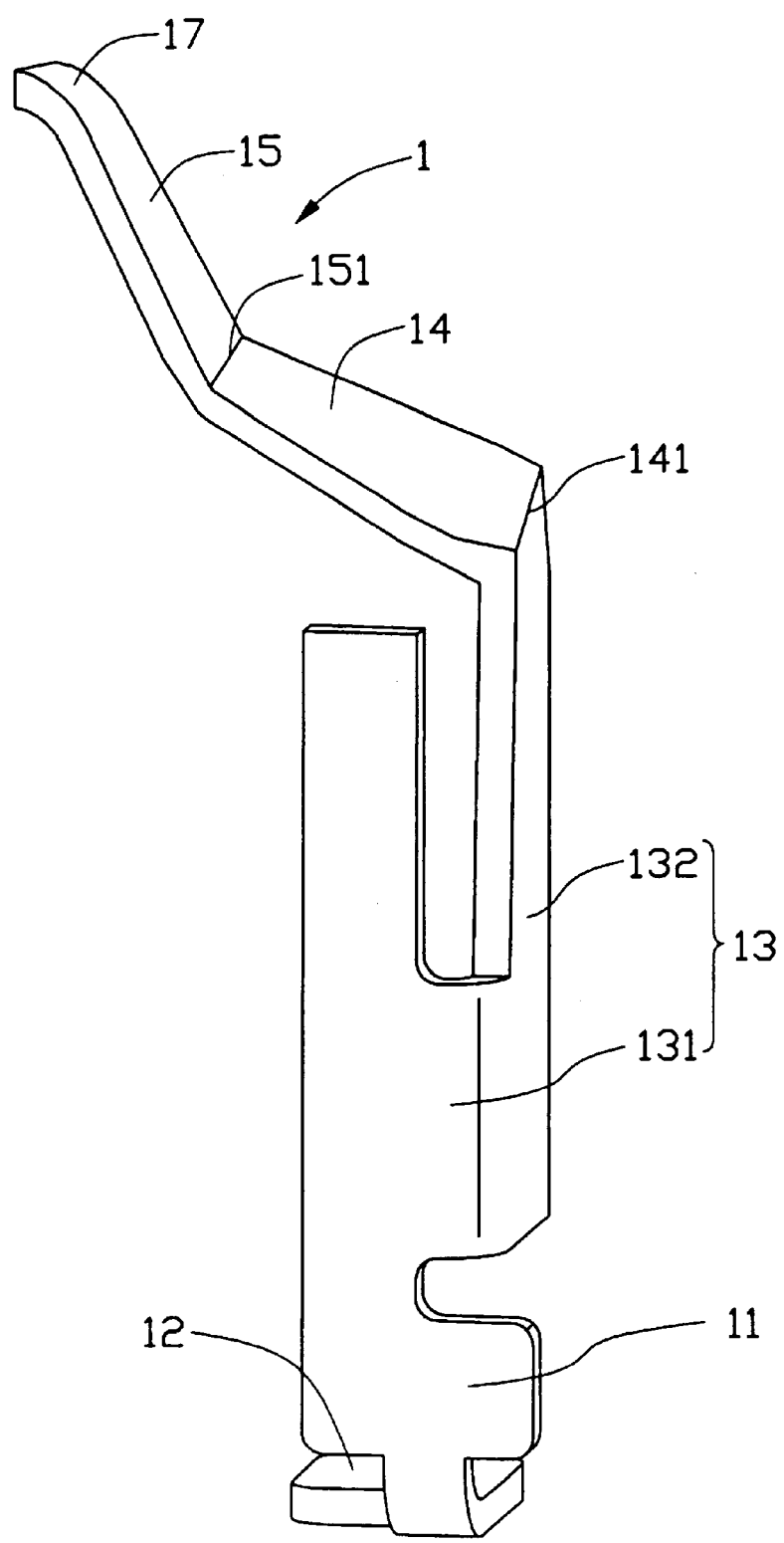
FIG. 1 is an enlarged, perspective view of an electrical contact for an electrical connector in accordance with a preferred embodiment of the present invention.

Referring to FIGS. 1 and 2, each electrical contact 1 comprises an engaging portion 11 for engaging with the slot 43 of the passageway 41, a medial portion 13 extending upwardly from an end of the engaging portion 11, an inclined portion 14 extending aslant from the medial portion 13, a cantilever 15 extending from the inclined portion 14, and a solder portion 12 extending perpendicularly from an opposite end of the engaging portion 11. The medial portion 13 defines a first member 131 and a second member 132. The first member 131 extends upwardly from the end of the engaging portion 11, and the second member 132 extends sidewardly and perpendicularly from a lower portion of the first member 131. The second member 132 and the inclined portion 14 form a connecting portion therebetween having a first line 141. The first line 141 forms an acute angle relative to the surface 42 of the base 4. Thus, the inclined portion 14 extends in a direction not parallel to the engaging portion 11. When the contacts 1 are received into the base 4, each passageway 41 has sufficient space to receive the inclined portion 14 and the cantilever 15 of the contact 1. The inclined portion 14 and the cantilever 15 form a connecting portion therebetween having a second line 151. The second line 151 also forms an angle relative to the surface 42 of the base 4. Thus, a contact portion 17 on an upper end of the cantilever 15 is substantially parallel to the surface 42 of the base 4.

Figure 3:
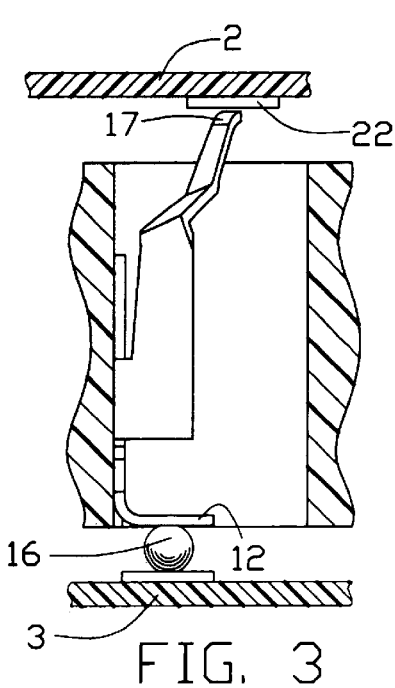
FIG. 3 is a cross-sectional view of the base of FIG. 2 taken along line III—III thereof, showing a solder portion of the contact in the passageway connected with a PCB via a solder ball, and an LGA package above the base ready to be connected with the contact.
Figure 4:
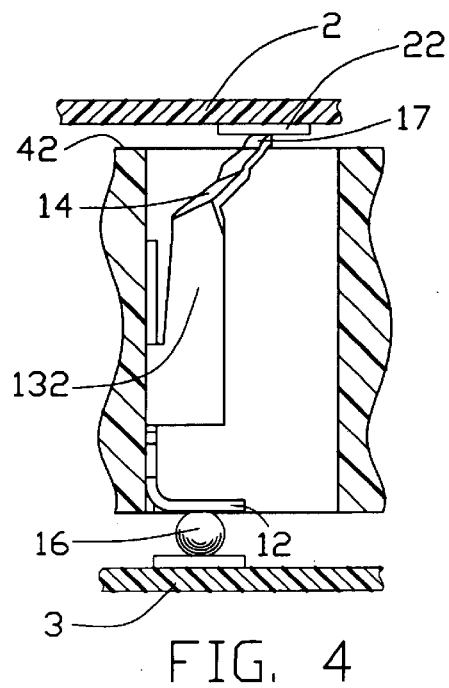
FIG. 4 is similar to FIG. 3, but showing the LGA package connected with the contact.
Figure 5:
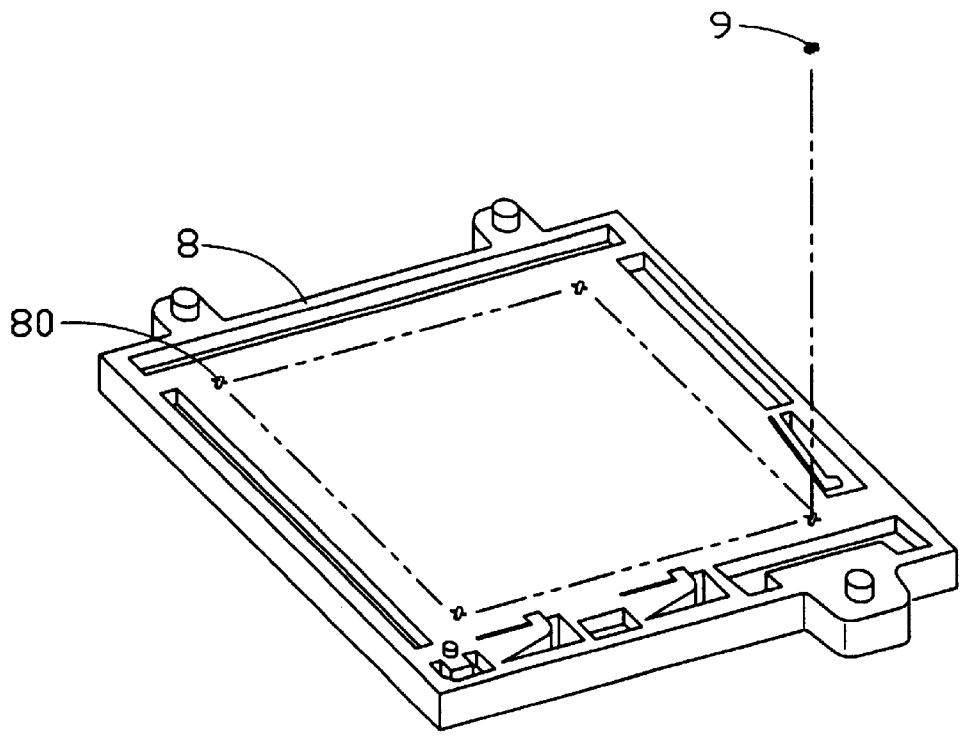
FIG. 5 is an exploded, perspective view of a conventional electrical connector.
Figure 6:
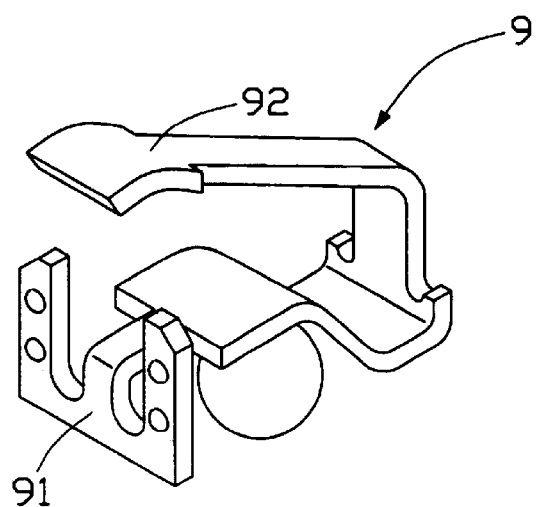
FIG. 6 is an enlarged, perspective view of the contact in FIG. 5.
Figure 7:
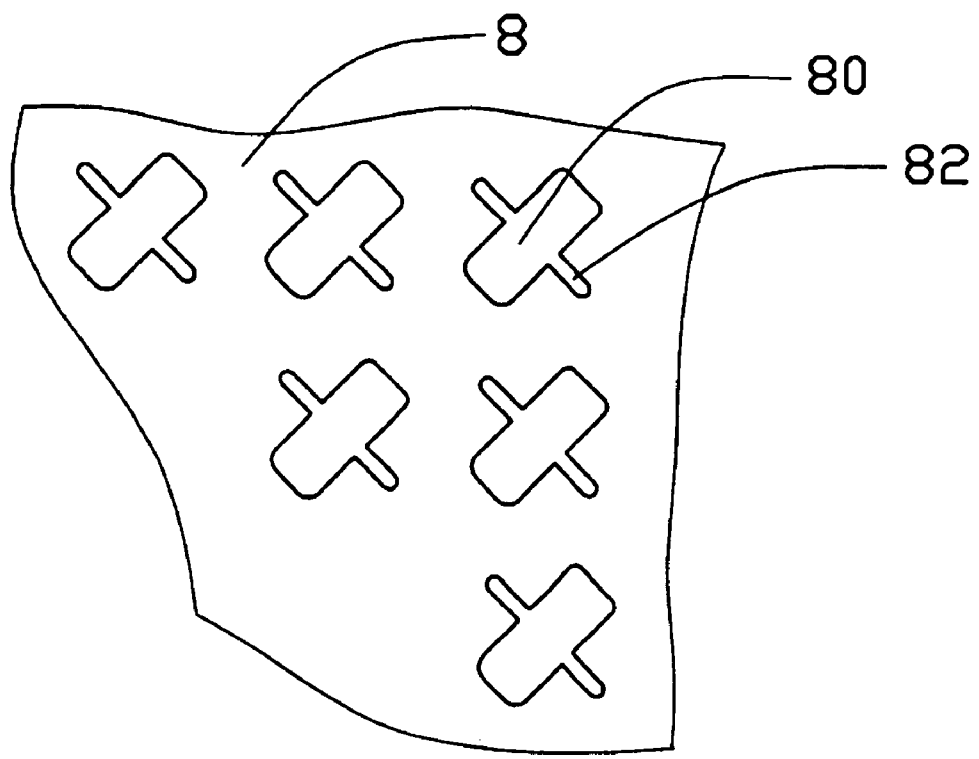
FIG. 7 is an enlarged, top plan view of part of the base of FIG. 5.

Referring to FIGS. 3 and 4, the solder portion 12 of each contact 1 received in the base 4 is adapted to connected with a solder ball 16. Thus, the solder portion 12 connects electrically with the PCB 3 via the solder ball 16. When the CPU 2 is not touching the contact portion 17 of the contact 1, the cantilever 15 and the inclined portion 14 of the contact 1 do not deform. But when the CPU 2 is driven downwardly by externally applied force to press the contact portion 17, the cantilever 15 and the inclined portion 14 elastically deform toward the PCB 3, thus the contact portion 17 reliably contacts a metal pad 22 of the CPU 2, which enables reliable electrical connection between the CPU 2 and PCB 3.

While a preferred embodiment in accordance with the present invention has been shown and described, equivalent modifications and changes known to persons skilled in the art according to the spirit of the present invention are considered within the scope of the present invention as defined in the appended claims.

I claim:

1. An electrical connector comprising:

a base defining a plurality of passageway and a surface, each passageway defining a slot on an inside wall thereof, the passageways being defined in the base in a matrix of rows:

a plurality of contacts engagingly received in corresponding passageways, each contact comprising an engaging portion for engaging in the slot of the passageway, a medial portion, an inclined portion, and a cantilever extending from the inclined portion;

wherein the medial portion defines a first member extends upwardly from the engaging portion, and a second member extends sidewardly and perpendicularly from a lower of the first member;

wherein the inclined portion extends from an upper edge of the first member forming a first connecting portion therebetween defining a first line, the first line forming an acute angle relative to the surface of the base when the contact is assembled in the base;

wherein the cantilever portion extends from the inclined portion forming a second connecting portion defining a second line, the second line forming an angle relative to the surface of the base;

wherein each contact further defines a solder portion extending perpendicular from the engaging portion; and wherein the cantilever comprise a contact portion on an upper end thereof.

2. The electrical connector as claimed in claim 1, wherein the slots of each row of the passageways align along a line, and the contacts situated along one row are inserted into the passageways of the base at the same time.

* * * * *